US006262440B1

(12) United States Patent
Haberern et al.

(10) Patent No.: US 6,262,440 B1
(45) Date of Patent: *Jul. 17, 2001

(54) METAL ELECTRICAL CONTACT FOR HIGH CURRENT DENSITY APPLICATIONS IN LED AND LASER DEVICES

(75) Inventors: Kevin W. Haberern, Cary, NC (US); Paulette Kellawon, Carmel; Nikhil Taskar, Ossining, both of NY (US)

(73) Assignee: Philips Electronics North America Corp., New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,711

(22) Filed: Jun. 29, 1998

(51) Int. Cl.$^7$ .......................... H01L 33/00; H01L 29/45; H01L 29/20
(52) U.S. Cl. .............................. 257/99; 257/103; 257/81; 257/745; 257/751; 257/761
(58) Field of Search ................ 257/81, 99, 745, 257/751, 761, 103

(56) References Cited

U.S. PATENT DOCUMENTS

| | | | |
|---|---|---|---|
| 4,613,890 | * 9/1986 | Schairer | 257/763 |
| 4,774,151 | * 9/1988 | Cuomo | 428/698 |
| 4,849,802 | * 7/1989 | Jackson | 257/743 |
| 5,646,426 | * 7/1997 | Cockrum | 257/442 |
| 5,990,500 | * 11/1999 | Okajaki | 257/99 |

OTHER PUBLICATIONS

Ponce, ed. *GaN and Related Materials* "Metallurgical ;. Nitride" Mohney et al. MRS Pitt. Penn. 1$^{st}$ Int. Symp. GaN and Related Materials pp. 843–848, Dec. 1995.*

PHA 23,309, U.S. application No. 08/991,522, filed Dec. 16, 1997.

* cited by examiner

*Primary Examiner*—Jerome Jackson, Jr.
(74) *Attorney, Agent, or Firm*—Michael E. Belk

(57) ABSTRACT

A light-emitting semiconductor device such as a laser or LED includes a light-emitting region interposed between two GaN contact layers of different conductivity types. A metal electrical contact is provided directly on one of the contact layers and is formed of an annealed, at least partly alloyed metal layer including hafnium and gold. The metal layer may also include platinum, or platinum and titanium. Light-emitting semiconductor devices such as light-emitting diodes and lasers having such annealed, at least partly alloyed metal layer are particularly suitable for high current-density applications which result in higher operating temperatures, such they are capable of operating at higher temperatures without shorting.

18 Claims, No Drawings

METAL ELECTRICAL CONTACT FOR HIGH CURRENT DENSITY APPLICATIONS IN LED AND LASER DEVICES

BACKGROUND OF THE INVENTION

The invention is in the field of light-emitting semiconductor devices such as light-emitting diodes (LEDs) and lasers, and relates more particularly to metal electrical contacts for such devices.

Presently, LED devices having GaN contact layers are typically provided with metal electrical contacts of an alloy of nickel and gold. A representative LED device having GaN contact layers and metal electrical contacts of a nickel-gold alloy are shown in U.S. patent application Ser. No. 08/991,522 of Taskar et al, filed Dec. 16, 1997, and incorporated herein by reference in its entirety. While such nickel-gold alloy electrical contacts are entirely suitable for light-emitting semiconductor devices operating at low current density, and in fact are advantageous due to their relatively low resistance, they are not suitable for use in high-power light-emitting devices where high current densities are encountered. This is because such high-power, high current density devices typically operate at higher temperatures, at which the nickel-gold contacts will cause device failure by causing a short circuit in the device. It is believed that the nickel-gold contacts short the p-n junction of the device by migration of nickel or nickel compounds through defects within the GaN contact layer material at relatively low temperatures.

In order to overcome this deficiency, experiments have been conducted with metal electrical contacts formed of titanium-gold alloys, which have been found to function at an intermediate temperature at which nickel-gold alloy contacts would typically short, with the disadvantage of a somewhat greater contact resistance. Additionally, since titanium-gold alloy contacts will still cause short circuits at temperatures lower than those required for operation by high current density, high-power devices, a substantial need exists for a metal electrical contact composition which can successfully operate at high current densities and high temperatures without creating a short circuit in the light-emitting semiconductor devices in which they are employed.

SUMMARY OF THE INVENTION

It is therefore an object of the invention to provide a light-emitting semiconductor device such as an LED or a laser having gallium nitride contact layers with a metal electrical contact capable of withstanding relatively high temperatures and current densities so that the semiconductor device can operate at high power levels. It is a further object of the invention to provide such a metal electrical contact which exhibits acceptable electrical properties at high power levels.

In accordance with the invention, these objects are achieved in a light-emitting semiconductor device of the type described above in which the metal electrical contact is formed of an annealed, at least partly alloyed metal layer comprising elemental hafnium and elemental gold.

In a further embodiment of the invention, the annealed, at least partly alloyed metal layer may additionally comprise platinum, or platinum and titanium.

Light-emitting semiconductor devices having metal electrical contacts in accordance with the invention offer a significant improvement in that such devices may be operated at high current density and high power levels without shorting out.

These and other aspects of the invention will be apparent from and elucidated with reference to the embodiments described hereinafter.

DESCRIPTION OF THE PREFERRED EMBODIMENTS

Light-emitting semiconductor devices such as LEDs and lasers can be constructed with a light-emitting region interposed between two GaN contact layers of differing conductivity types, with a metal electrical contact provided directly on one of these contact layers. While one such device is shown in the Taskar et al application mentioned above, it will be recognized that the invention is not limited to any particular light-emitting semiconductor device structure.

In accordance with the invention, an improved ability to withstand high current densities and high temperatures is achieved by providing a metal electrical contact which is formed of an annealed, at least partly alloyed metal layer comprising hafnium and gold. A preferred and well-known technique for forming such an alloyed metal electrical contact is to evaporate and subsequently deposit successive layers of hafnium and gold onto the GaN contact layer to be provided with the metal contact, and then at least partly alloy these metals by an annealing treatment.

Thus, by way of a nonlimitative example, a first metal layer of hafnium may be deposited on the GaN contact layer to a thickness in the range of 50 up to several hundred angstroms, with a layer of gold in the thickness range of about 300–10,000 angstroms being deposited on top of the hafnium. This layered metal structure is then at least partly alloyed by an annealing step, typically by heating to a temperature of about 550° C. for about 5 to 10 minutes or to a temperature of about 700° for about 0.5–1 minute. Alternatively, the alloyed metal layer may be formed by the known technique of first creating an alloy of gold and hafnium, followed by evaporation and deposition to create an alloyed metal electrical contact on the GaN contact layer. While the precise ratio of hafnium to gold is not critical to the invention, the ratio may typically be in the range of about 1:5 to about 1:200 by volume, with the precise ratio being selected depending upon the desired electrical and thermal properties of the finished device. In general, an increased percentage of hafnium will correspond to improved thermal stability at the expense of somewhat higher electrical resistance. However, since devices in accordance with the invention are capable of operating at current densities in temperatures at which prior-art devices would fail, degraded electrical properties (i.e. a greater voltage drop) are a reasonable trade-off.

Initial experiments have verified that light-emitting semiconductor devices provided with hafnium-gold alloy metal contacts offer improved thermal stability at high temperatures. In particular, whereas devices provided with nickel-gold and titanium-gold contacts shorted out after annealing at 700° C. for 5 minutes, devices with hafnium-gold alloy metal contacts remained Schottky (i.e. did not short) at this temperature.

Additionally, although the electrical properties of the hafnium-gold alloy contacts were not as good as those of the nickel-gold or titanium-gold contacts, they did in fact improve with annealing to the point where they became competitive with the electrical properties of titanium-gold.

In order to improve the electrical performance of the metal electrical contacts, at the possible expense of some reduction in thermal stability, small amounts of platinum, or platinum and titanium, may be added to the hafnium and gold. Thus, for example, a metal electrical contact of hafnium and gold with a small amount of platinum (about 50–100 angstroms) remained Schottky at 750° C. while exhibiting improved electrical characteristics. It will be recognized, however, that the addition of platinum or platinum and titanium may degrade the thermal stability of the device, so that the amount of these metals to be added will be a function of the degree to which thermal performance can be sacrificed to achieve improved electrical performance.

While the invention has been particularly described with reference to several preferred embodiments thereof, it will be understood by those skilled in the art that various changes and detail may be made without departing from the spirit or scope of the invention.

What is claimed is:

1. A light-emitting semiconductor device comprising a light-emitting region interposed between a first GaN contact layer of a first conductivity type and a second GaN contact layer of a second opposite conductivity type, and a metal electrical contact provided directly on one of said contact layers, characterized in that said metal electrical contact is formed of an annealed, at least partly alloyed, metal layer comprising elemental hafnium and elemental gold.

2. A light-emitting semiconductor device as in claim 1, wherein said annealed metal layer further comprises platinum.

3. A light-emitting semiconductor device as in claim 2, wherein said annealed metal layer further comprises titanium.

4. A light-emitting semiconductor device as in claim 1, wherein said device is a light-emitting diode.

5. A light-emitting semiconductor device as in claim 1, wherein said device is a laser.

6. A light-emitting semiconductor device as in claim 1, wherein the conductivity type of the GaN contact layer upon which the metal electrical contact is directly provided is p-type.

7. A light-emitting semiconductor device as in claim 1, wherein the conductivity type of the GaN contact layer upon which the metal electrical contact is directly provided is n-type.

8. A light-emitting semiconductor device comprising a light-emitting region interposed between a first GaN contact layer of a first conductivity type and a second GaN contact layer of a second opposite conductivity type, and a metal electrical contact provided directly on one of said contact layers, characterized in that said metal electrical contact is formed of a metal layer comprising elemental hafnium and elemental gold.

9. A semiconductor device as in claim 8 wherein said metal layer has been annealed.

10. A semiconductor device as in claim 8 wherein said elemental hafnium and elemental gold are at least partly alloyed with each other.

11. A semiconductor device as in claim 8 wherein said metal layer further comprises platinum.

12. A semiconductor device as in claim 11 wherein said metal layer further comprises titanium.

13. A light-emitting semiconductor device comprising a light-emitting region interposed between a first GaN contact layer of a first conductivity type and a second GaN contact layer of a second opposite conductivity type, and a metal electrical contact provided directly on one of said contact layers, characterized in that said metal electrical contact is formed of a metal layer consisting essentially of elemental gold, elemental hafnium and optionally minor amounts of platinum and/or titanium.

14. A light-emitting semiconductor device comprising a light-emitting region interposed between a first GaN contact layer of a first conductivity type and a second GaN contact layer of a second opposite conductivity type, and a metal electrical contact provided directly on one of said contact layers, characterized in that said metal electrical contact is formed of a metal layer consisting essentially of a group of metals, said group of metals including elemental hafnium and elemental gold.

15. A semiconductor device as in claim 14 wherein said elemental hafnium and elemental gold are at least partly alloyed with each other.

16. A semiconductor device as in claim 14 wherein said metal layer has been annealed.

17. A semiconductor device as in claim 14 wherein said group of metals includes platinum.

18. A semiconductor device as in claim 17 wherein said group of metals includes titanium.

* * * * *